(12) United States Patent
Devereux et al.

(10) Patent No.: US 8,736,397 B2
(45) Date of Patent: May 27, 2014

(54) KU-BAND COAXIAL TO MICROSTRIP MIXED DIELECTRIC PCB INTERFACE WITH SURFACE MOUNT DIPLEXER

(75) Inventors: Jeff Devereux, Solana Beach, CA (US); Fritz Gerd Berger, Vista, CA (US); William A. Johnston, Poway, CA (US); Mohammad Ali Tassoudji, Cardiff, CA (US); Scott Aldern, Encinitas, CA (US)

(73) Assignee: Omnitracs, LLC, San Diego, CA (US)

( * ) Notice: Subject to any disclaimer, the term of this patent is extended or adjusted under 35 U.S.C. 154(b) by 1479 days.

(21) Appl. No.: 12/376,759

(22) PCT Filed: Aug. 31, 2007

(86) PCT No.: PCT/US2007/077360
§ 371 (c)(1),
(2), (4) Date: Jul. 1, 2010

(87) PCT Pub. No.: WO2008/030772
PCT Pub. Date: Mar. 13, 2008

(65) Prior Publication Data
US 2010/0265153 A1 Oct. 21, 2010

Related U.S. Application Data

(60) Provisional application No. 60/843,342, filed on Sep. 7, 2006, provisional application No. 60/844,180, filed on Sep. 12, 2006.

(51) Int. Cl.
*H01P 5/08* (2006.01)
(52) U.S. Cl.
CPC ..................................... *H01P 5/085* (2013.01)
USPC ............................................. 333/33; 333/246
(58) Field of Classification Search
USPC ............ 343/841, 711, 712, 713, 715; 333/32, 333/33, 246, 247, 260, 24 C, 243
See application file for complete search history.

(56) References Cited

U.S. PATENT DOCUMENTS

| 3,428,918 A | 2/1969 | Matthaei |
| 4,168,393 A | 9/1979 | Silva |

(Continued)

FOREIGN PATENT DOCUMENTS

CN 101667811 A 3/2010

OTHER PUBLICATIONS

Database Compendex (Online) Engineering Information, Inc., New York, NY, US; Sung Y et al: "Parallel-coupled microstrip bandpass filters with a wide stopband using spur lines" XP002466589 Database accession No. E2004408385311 abstract; figures 1-3 p. 10 & Microwave Opt Technology Letters Oct. 5, 2004, vol. 43, No. 1, pp. 9-11.

(Continued)

*Primary Examiner* — Benny Lee
*Assistant Examiner* — Gerald Stevens
(74) *Attorney, Agent, or Firm* — Arent Fox LLP (57) ABSTRACT

A coaxial to microstrip transition is introduced in a multi layer mixed dielectric printed circuit board environment that provides a 50 Ohm impedance system between a coaxial antenna feed and a surface mount diplexer at Ku-band frequencies. The 50 Ohm transition from the coaxial antenna feed to the diplexer at microwave frequencies lossy FR-4 style laminate is provided by constructing a PCB internal coax using the center conductor of the antenna feed and a dual ring of plated through hole VIAs. The transition from the PCB internal coax to the microstrip section of the high frequency laminate PCB layer uses a "D"-style opening in the ground layer and a VIA ring arrangement between the layers to optimize or tune the performance of the transition. Additional features in the interface construction are implemented to guaranty that its microwave and mechanical performance does not degrade in extreme environmental conditions.

27 Claims, 13 Drawing Sheets

(56) References Cited

U.S. PATENT DOCUMENTS

| | | |
|---|---|---|
| 4,168,479 A | 9/1979 | Rubin |
| 5,015,976 A | 5/1991 | Saka |
| 5,192,927 A | 3/1993 | Lin |
| 6,483,393 B1 | 11/2002 | How |
| 6,762,660 B2 | 7/2004 | Allison |
| 6,909,343 B2 | 6/2005 | Iio |
| 6,992,544 B2 | 1/2006 | Barnes et al. |
| 7,145,418 B2 | 12/2006 | Akale et al. |
| 7,420,438 B2 * | 9/2008 | Nakai et al. .................. 333/133 |
| 7,652,548 B2 | 1/2010 | Yoshikawa et al. |
| 8,198,954 B2 * | 6/2012 | Makino et al. ................. 333/33 |
| 2003/0052755 A1 | 3/2003 | Barnes et al. |
| 2003/0073460 A1 | 4/2003 | van Pelt et al. |
| 2003/0080836 A1 | 5/2003 | Nagaishi et al. |
| 2003/0155989 A1 * | 8/2003 | Ling et al. ........................ 333/33 |
| 2004/0061652 A1 * | 4/2004 | Ishihara et al. ............... 343/752 |
| 2010/0188167 A1 | 7/2010 | Devereux et al. |

OTHER PUBLICATIONS

International Search Report—PCT/US07/077896, International Search Authority—European Patent Office—Feb. 11, 2008.

International Search Report for International Application No. PCT/US2007/077360, dated Aug. 5, 2008, issued by the European patent Office.

Written Opinion—PCT/US2007/077360—ISA/EPO—Aug. 5, 2008.

* cited by examiner

Fig. 13

KU-BAND COAXIAL TO MICROSTRIP MIXED DIELECTRIC PCB INTERFACE WITH SURFACE MOUNT DIPLEXER

CLAIM OF PRIORITY UNDER 35 U.S.C. §119

The present application for patent claims priority to Provisional Application No. 60/843,342, filed on Sep. 7, 2006, entitled Diplexer Design and Provisional Application and No. 60/844,180, filed on Sep. 12, 2006, entitled Diplexer Design, and assigned to the assignee hereof and hereby expressly incorporated by reference herein.

BACKGROUND

1. Field

The present invention relates to transceivers and more particularly to a Ku-band satellite transceiver with a mixed dielectric printed circuit board (PCB) interface containing a coaxial to microstrip transition which is connected to a surface mount diplexer.

2. Background

Starting in the late 1980's companies such as Qualcomm Inc. developed satellite communication systems which provided two-way communication between trucks and a centralized hub for the trucking industry. In the case of Qualcomm Inc., an integral part of its satellite based system is a mobile satellite data modem (SDM) unit which is mounted on the outside of the truck cabin to establish an airlink to a geostationary Ku-band transponder. These SDM units contain sophisticated Ku-band transceivers which are exposed to a wide variety of environmental conditions such as extreme weather, shock, and vibration. Among other components the Ku-band transceiver's radio frequency (RF) front end with its interface to the antenna is crucial for the performance of transmit and receive chains. The configuration of this interface needs to provide a low loss, continuous transmission line link between the antenna feed and the microwave circuits on the transceiver's printed circuit board which can withstand mentioned environmental extremes.

Presently, most interfaces consist of a connectorized link between the antenna feed and a single layer microwave board implementation of a diplexer which isolates the receive chain from the transmit chain.

The present invention combines the Ku-band transceiver's microwave section together with its ancillary analog/digital circuitry on a mixed dielectric hybrid PCB stack-up which has the high frequency substrate laminated on top of a standard multi layer FR-4 style core. In order to keep the microwave section compact and to provide an easy implementation for the coaxial antenna feed to printed circuit board transition, the diplexer is implemented as a surface mountable part using a ceramic substrate and is described in a co-pending patent application. In order to provide a low loss transition of less than (<) 1 dB at Ku-band frequencies from the microwave section of the satellite transceiver's PCB to its antenna, the interface needs to provide a good impedance match between the surface mount diplexer and the antenna feed (antenna probe). The microwave performance of this transition is further challenged since the PCB is a hybrid construction that consists of mixed dielectrics—at microwave frequencies highly lossy multi layer FR-4 style laminate and a single layer high frequency style laminate. On the mechanical side, this interface has to operate reliably in a rugged environment, such as a trucking environment, that is characterized through continuous vibration, shock, and a wide temperature range (from −40 degrees Celsius to +85 degree Celsius). From a manufacturing point of view the interface has to meet design for manufacturability standards in a high volume production environment.

A poorly designed/performing PCB interface would manifest itself in two scenarios:

Degraded (decreased) transmit power in the transmit chain of the satellite transceiver. This translates into increased transition insertion loss lowering the transmit power.

Degraded (increased) noise figure in the receive chain of the satellite transceiver. This translates into increased transition insertion loss increasing the noise figure.

SUMMARY

Embodiments disclosed herein address the above stated needs by providing a coaxial to microstrip transition in a multi layer mixed dielectric printed circuit board environment that provides a fifty (50) Ohm impedance system between a coaxial antenna feed and a surface mount diplexer at Ku-band frequencies. The fifty (50) Ohm transition from the coaxial antenna feed to the at microwave frequencies lossy FR-4 style laminate is provided by a PCB internal coax using the center conductor of the antenna feed and a dual ring of plated through hole VIAs. The transition from the PCB internal coax to the microstrip section of the high frequency laminate PCB layer is achieved by using a "D"-style opening in the metallic ground layer and a VIA ring arrangement between the layers to optimize or tune the performance of the transition.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
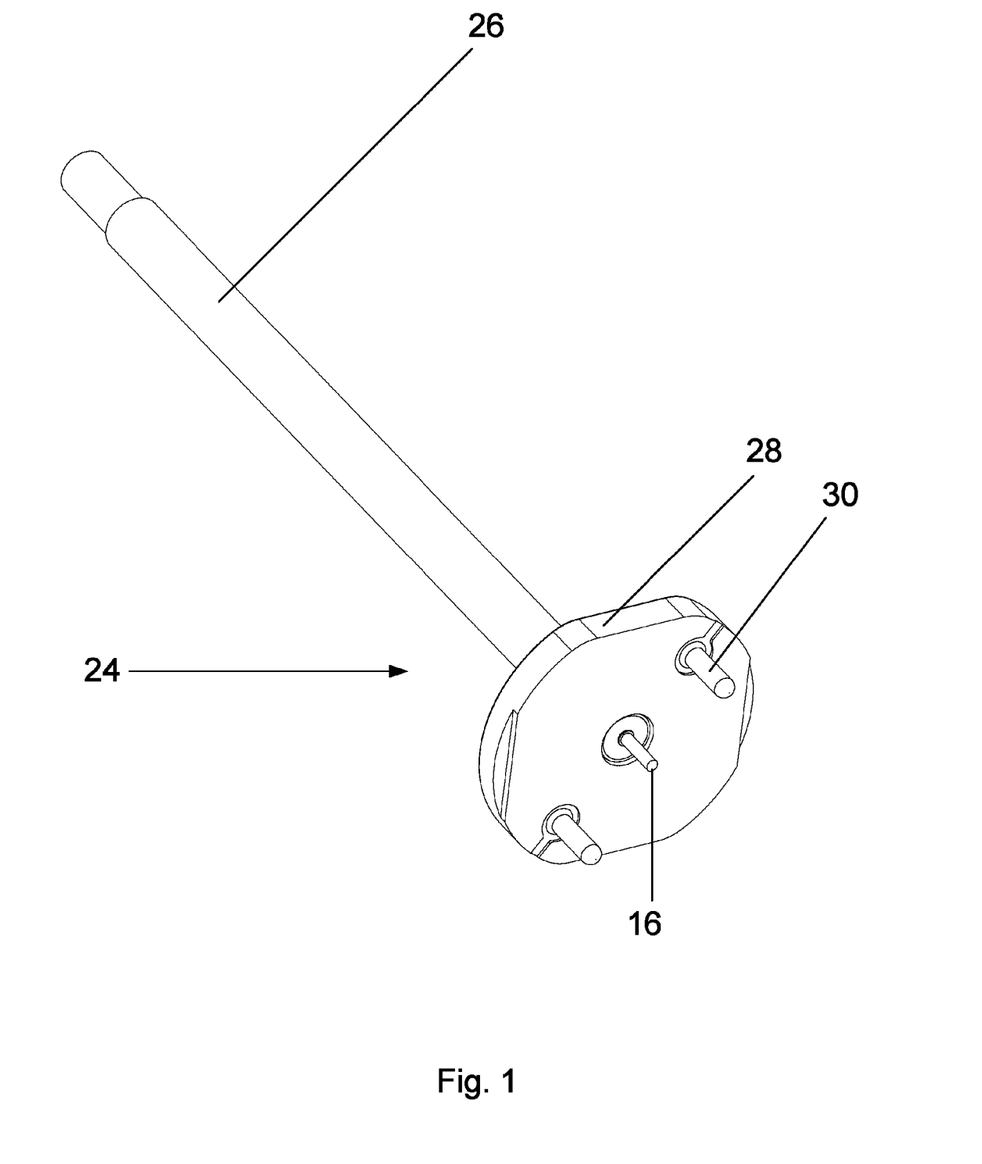
FIG. 1 shows the exemplary embodiment of antenna probe assembly.

FIG. 1 shows the exemplary embodiment of antenna probe assembly 24. Antenna probe assembly 24 consists of an external semi rigid coaxial transmission line 26 affixed through either a press fit or a solder connection to a metallic antenna probe base 28. Antenna probe base 28 has ground pins 30 for mounting antenna probe assembly 24 with a solder connection VIA plated through holes to PCB 10. Antenna probe center conductor 16 is electrically isolated and inserted through the center of external coaxial transmission line 26.

In order to contain the integrity of the interface and to minimize the transition insertion loss at Ku-band frequencies, the semi rigid coax needs to contain a dimensionally stable low loss low-density Polytetroflourethelene (LD PTFE) type dielectric. The dimensional stability characteristic prevents the dielectric from extruding longitudinally out of the outer conductor tube of external coaxial transmission line 26 during exposure to a wide temperature range or temperature shock conditions. This feature guaranties that antenna probe base 28 will not lose its tight contact to the backside of PCB 10 to assure continuous ground reference for the electromagnetic (EM) waves to propagate from external coaxial transmission line 26 into vertically formed coax, comprising antenna probe center conductor 16 within PCB 10.

Figure 2:
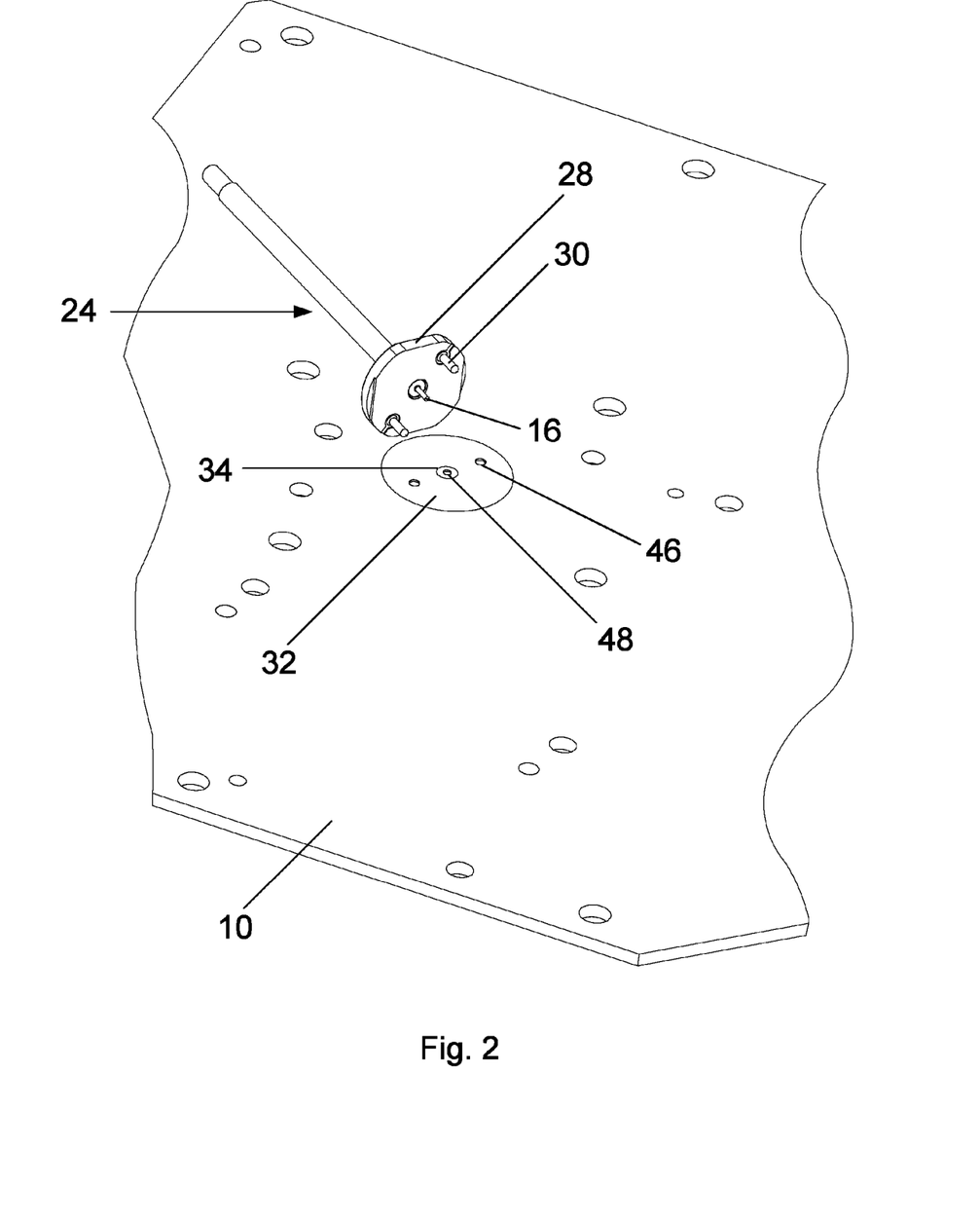
FIG. 2 shows the antenna probe next to a backside of a PCB before mounting.
Figure 3:
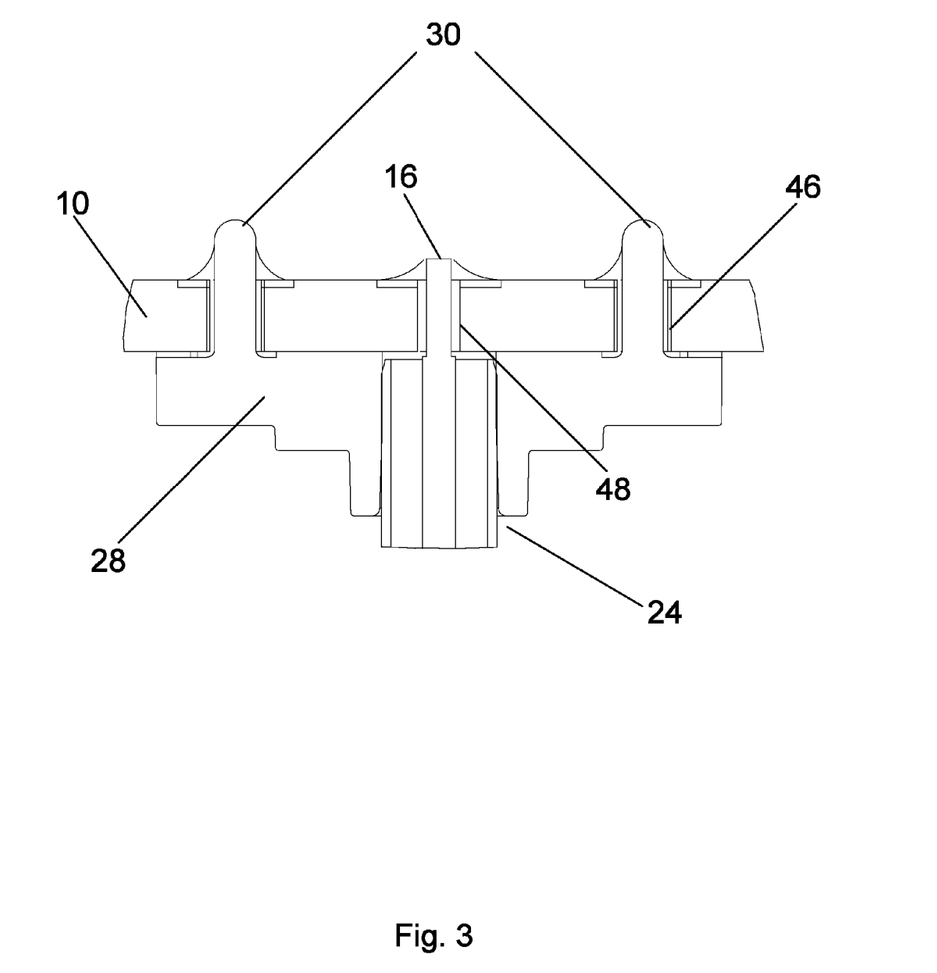
FIG. 3 is a cross sectional view of antenna probe assembly soldered to printed circuit board.
Figure 4:
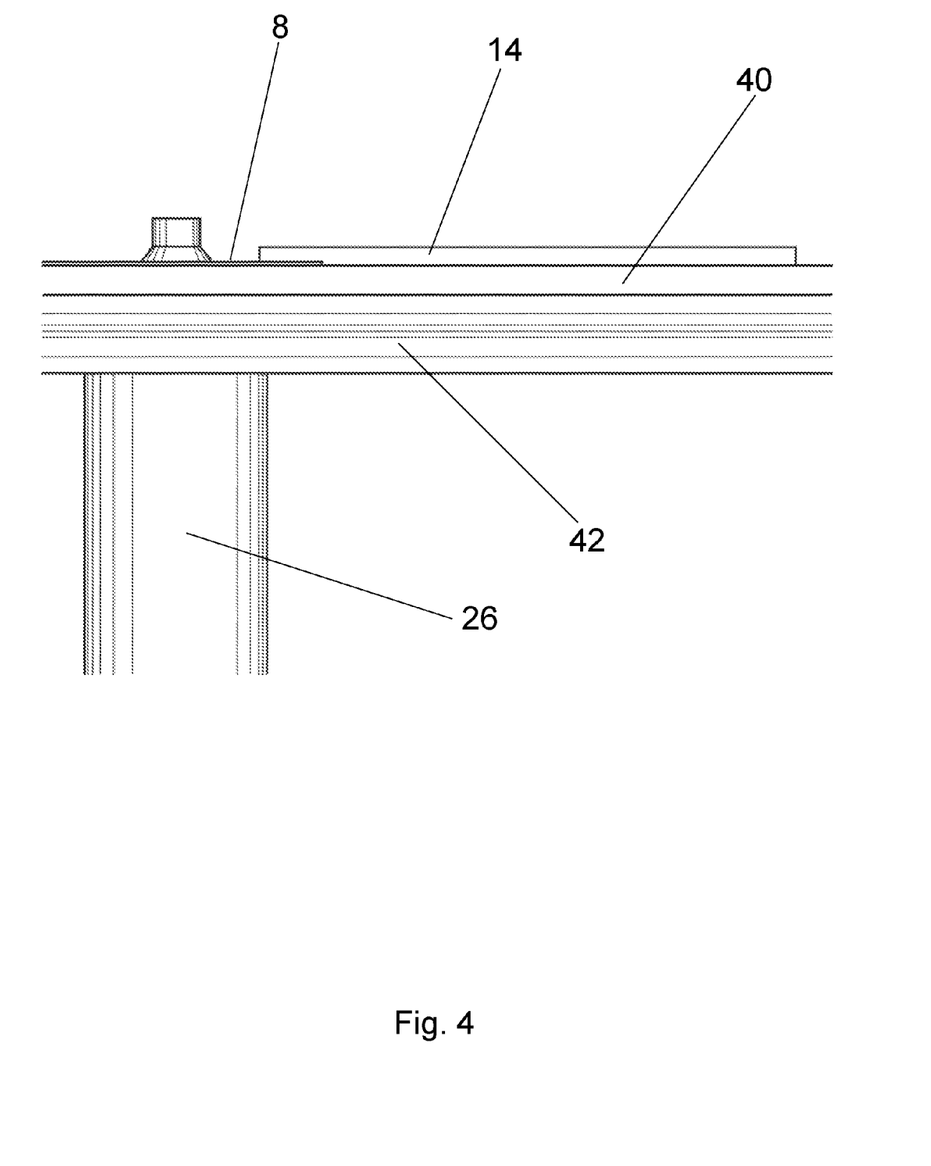
FIG. 4 is a cross sectional view of the printed circuit board and the ceramic diplexer.

FIG. 2. shows antenna probe assembly 24 placed on the backside of PCB 10 prior to mounting. Shown is antenna probe base 28 which is mounted on mounting pad 32. In order to provide a good high frequency reference, mounting pad 32 should preferably be a solder mask opening of the PCB backside and be part of a larger ground plane which is made from an electrically conductive material, such as copper. In the center of mounting pad 32 is a ground plane opening 34 and a non-plated through hole 48 for insertion of the antenna probe center conductor 16. The diameter of ground plane opening 34 has its outer edge as wide as the inner diameter of the external semi rigid coax tube which forms the outer conductor of the coaxial transmission line. This will assure a continuous ground connection between antenna probe assembly 24 and ground plane opening 34, in a region where high frequency currents are present. In another view, as seen in FIG. 3, antenna probe assembly 24 is affixed to PCB 10 by inserting and soldering ground pins 30 into plated through holes 46 which span the full vertical PCB thickness. At the same time antenna probe center conductor 16 is inserted into non-plated drill hole 48 and soldered on the top side of PCB 10 to a solder pad which comprises a thin annular copper ring. Finally, the surface of antenna probe base 28 is seated flush against the backside of PCB 10. If during the assembly process a small gap in the order of a few mils is comprised between the PCB 10 backside and antenna probe base 28, the interface will still be functional. The gap between the two metallic surfaces of the PCB 10 backside and antenna probe base 28 in this case, form a high frequency parallel plate capacitor through which electromagnetic waves can still propagate hence, making the interface tolerant to manufacturing tolerances. Other schemes of fastening the antenna probe assembly to PCB 10 include replacement of ground pins 30 with a screw system or the like. However, extreme temperature environments, vibration and cold flow conditions of the microwave laminate can loosen the torque of a screw system and therefore degrade the reliability of this interface. The whole interface assembly process as described can be achieved by means of mechanical fixturing to meet high volume manufacturability requirements FIG. 4 is a cross sectional view of PCB 10 and ceramic diplexer 14 of FIG. 10. PCB 10 is shown with a single layer of high frequency substrate 40 laminated onto multiple FR-4 style layers 42. This hybrid board construction allows for a compact printed circuit board, which combines microwave circuits with mixed analog/digital circuits. The advantages of this arrangement are that it allows for a very compact space saving structure and transitions between microwave circuits and digital/analog interface circuits can be implemented by means of standard printed circuit board features, such as VIAs, and multi layer controlled impedance structures, without the need for separate mechanical components such as connectors etc., which would be needed in case of a separate microwave printed circuit board and a separate digital/analog board. Microstrip transition 8 and surface mounted ceramic diplexer 14 are disposed on high frequency laminate 40 as shown. Also shown is external coaxial transmission line 26 of antenna probe assembly 24.

Figure 5:
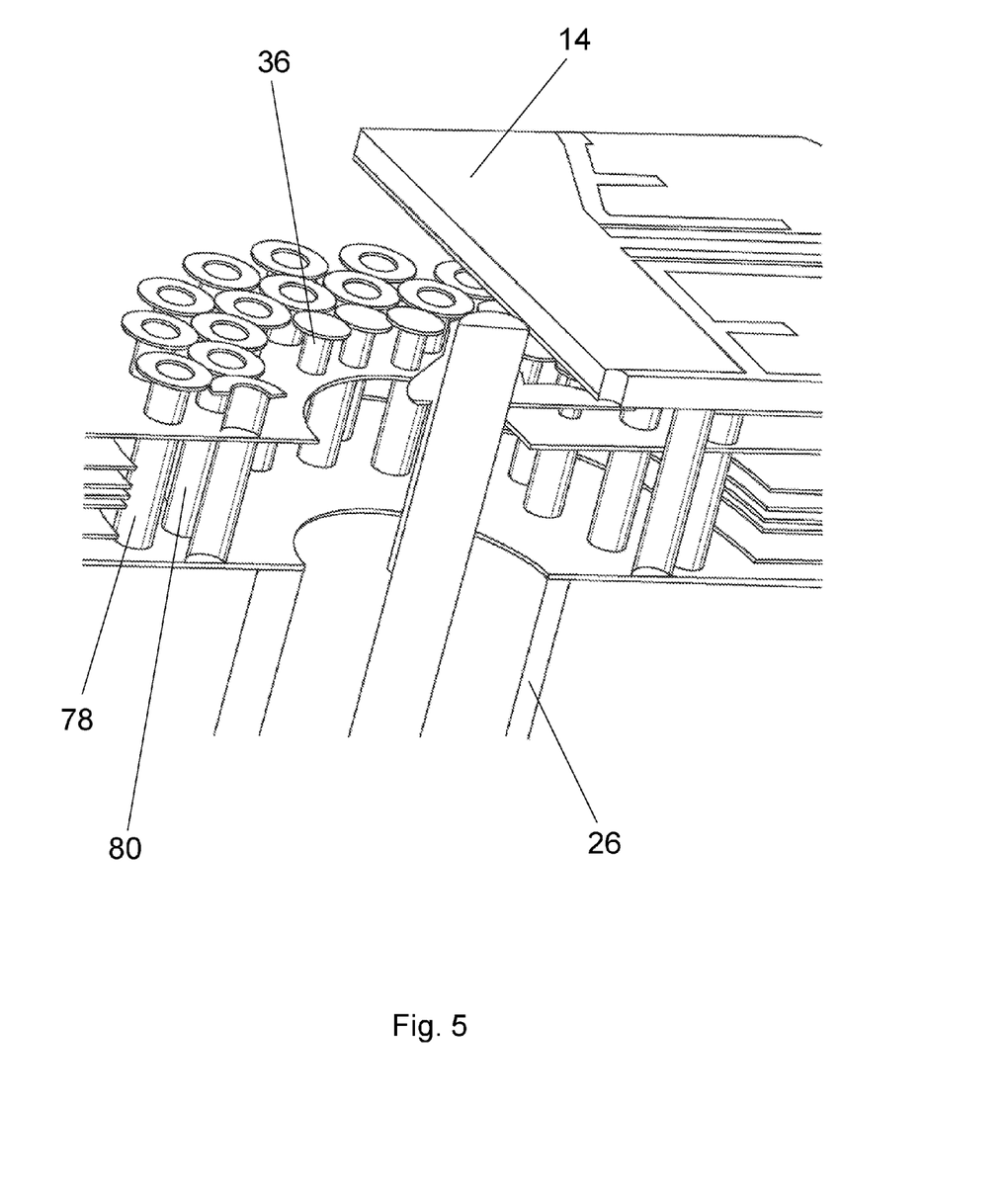
FIG. 5 is a cross sectional view of the coaxial to microstrip interface.
Figure 10:
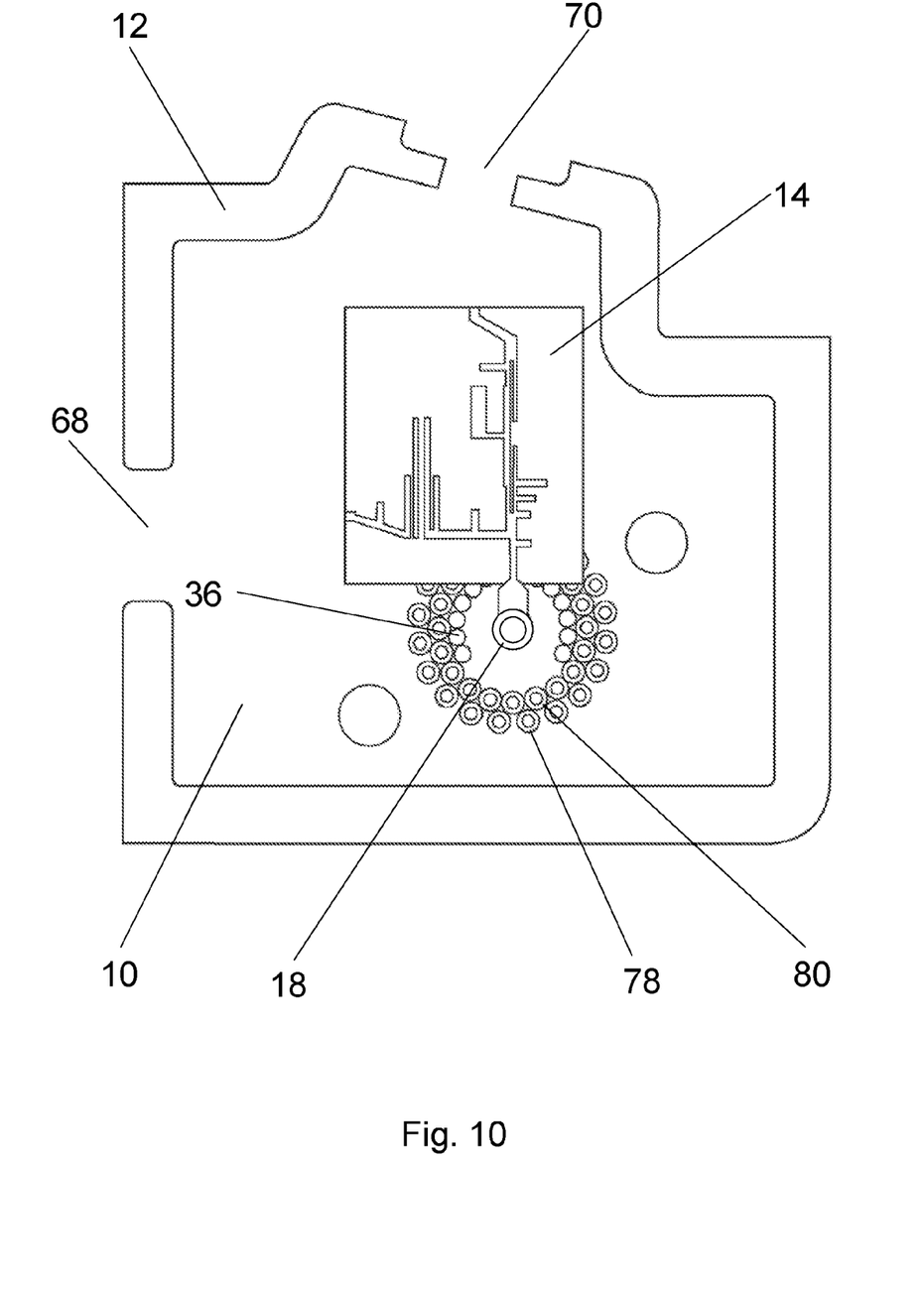
FIG. 10 is a top view of the PCB with the coaxial to microstrip transition.

FIG. 5 is a cross sectional view of the coaxial to microstrip interface of FIG. 10. In this view, plated through VIAs are shown which form the internal coaxial transmission line through the FR-4 style layers of PCB 10. The plated through hole VIAs constitute two VIA rings 78 and 80, which were chosen to form the outer conductor of this vertical transmission line. The distance from center to center between two neighboring VIAs within inner VIA ring 80 was chosen such that they are spaced one twentieth of the wavelength of the highest Ku-band frequency which propagates through this vertical coax. The VIAs in outer VIA ring 78 are placed so they fill in the remaining gaps formed by inner VIA ring 80 to assure that the fields of the propagating electromagnetic waves are contained within the inside of this formed coaxial transmission line and to prevent EMI leakage. The diameter of inner VIA ring 80 and consequently of outer VIA ring 78 depends upon the dielectric constant of the chosen FR-4 style laminate at Ku-band frequencies and can be calculated with formulas of standard coaxial transmission line theory and can additionally empirically be tuned to achieve an optimum fifty (50) Ohm system. All plated through hole VIAs of the two VIA rings 78 and 80 provide an electrical ground connection to any ground plane through which they pass. Also shown in FIG. 5 are tuning VIAs 36 which are located inside inner VIA ring 80 of the vertical coax and between the top surface of the microwave substrate layer and its ground reference plane one layer below.

Figure 6:
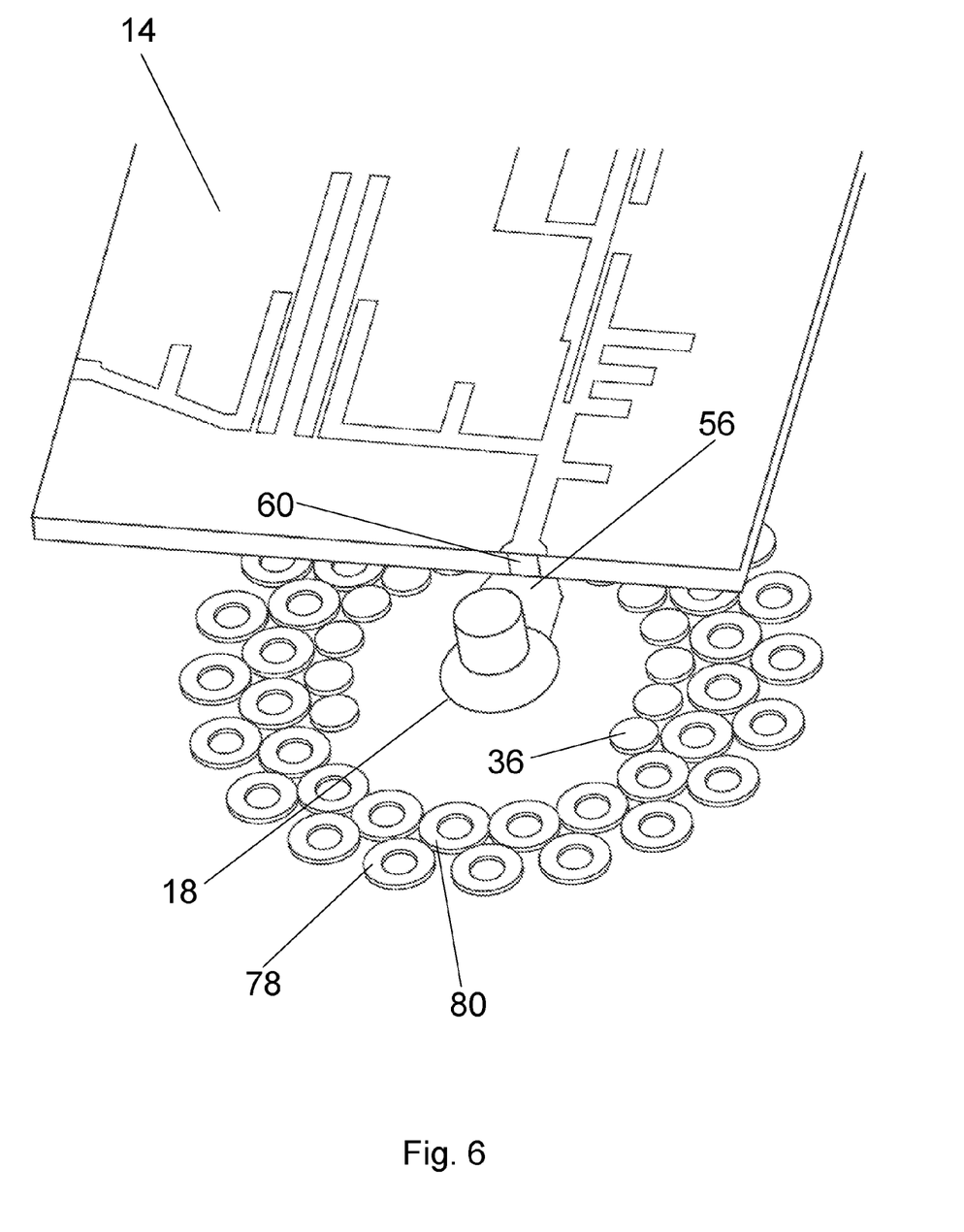
FIG. 6 is a top view of the PCB with the microstrip to surface mount diplexer transition.
Figure 7A:
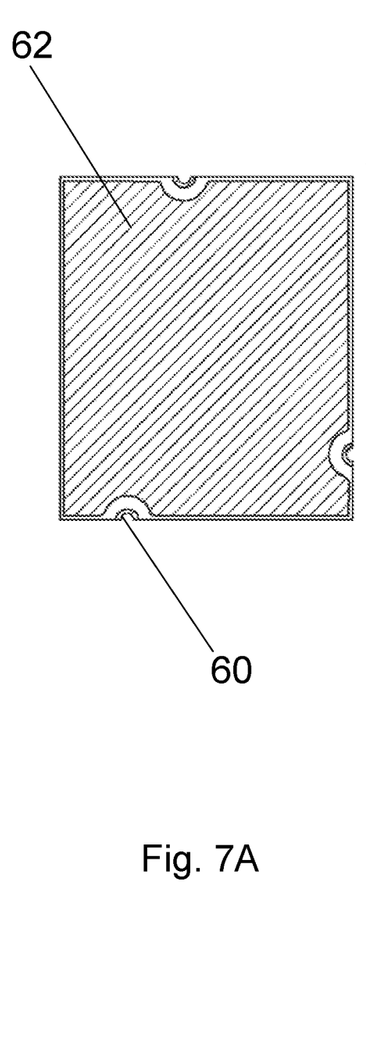
FIG. 7A depicts the ceramic diplexer backside.
Figure 7B:
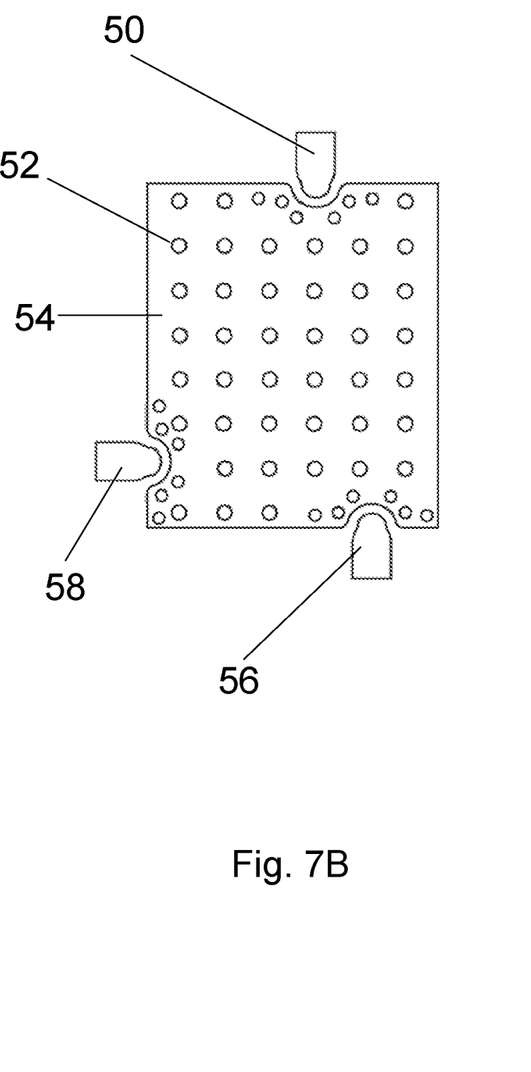
FIG. 7B depicts the PCB mounting footprint of the diplexer.
Figure 8:
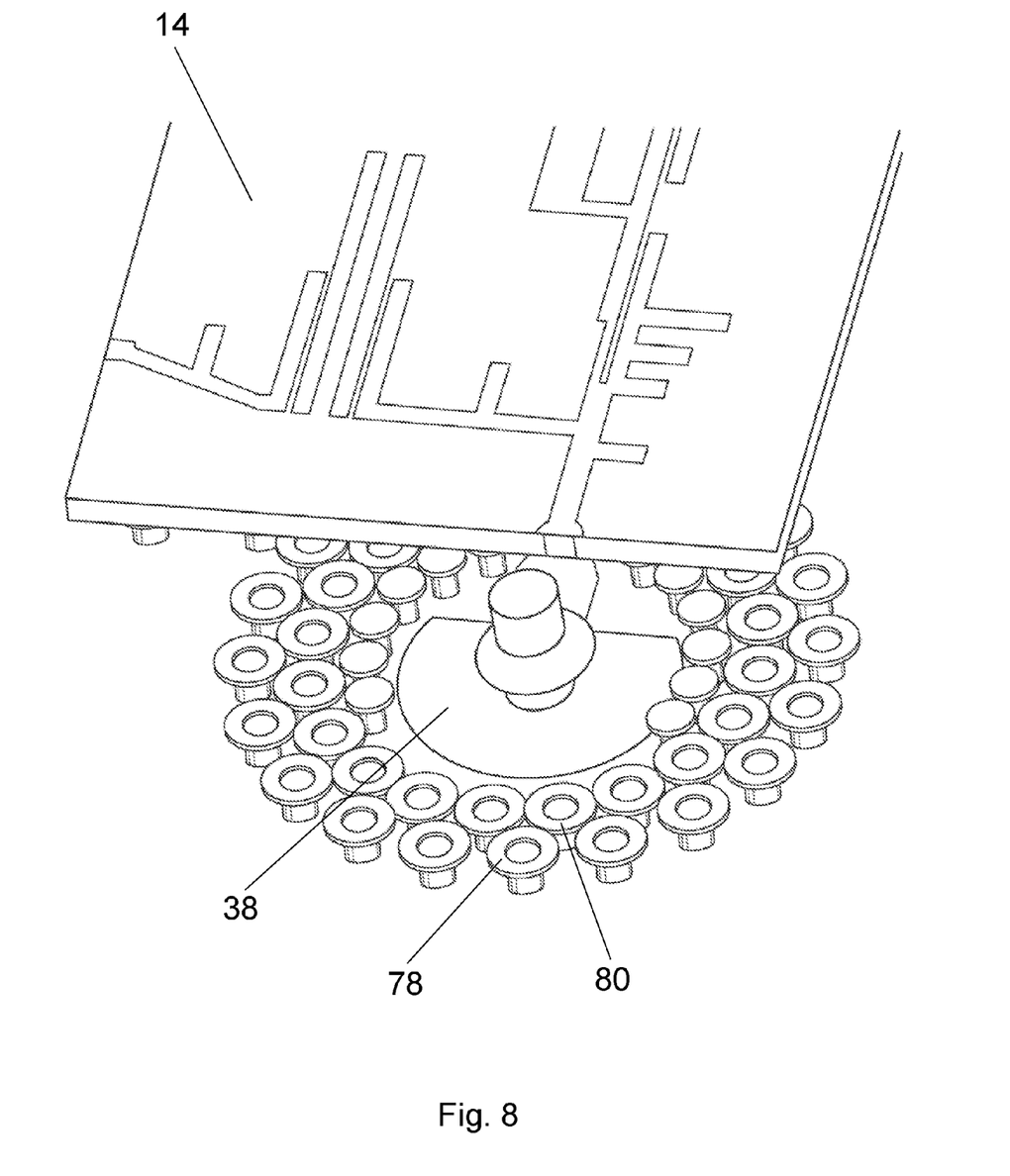
FIG. 8 shows the microstrip to surface mount diplexer transition showing "D" style ground plane opening.

FIGS. 6 and 8 show the top view of PCB 10 with microstrip to surface mount ceramic diplexer microstrip transition 56. The figures are zoomed in versions of microstrip transition 56. A surface mounted ceramic diplexer 14 is mounted to PCB 10 through a solder connection between its backside metallization layer 62, of FIG. 7A and a solid ground plane footprint 54 on the surface of the microwave substrate. The diplexer footprint is electrically connected with the printed circuit board ground planes through the depicted plated through hole VIA locations 52 and forms the reference layer for the microwave propagation across diplexer 14. As shown in FIG. 7B, diplexer port castillations 60 are placed and soldered right on top of the close ends of transmit port 50, antenna port 56, and receive port 58 microstrip lines. Ceramic diplexer 14 can be installed on the microwave substrate surface through standard circuit card assembly pick and place processes.

Diplexer antenna port microstrip line 56 connects to solder pad 18 to which antenna probe center conductor 16 is electrically connected, and forms the transition from the PCB internal coax to diplexer antenna port microstrip line 56.

The position of ceramic diplexer 14 was purposely chosen to be on the edge of dual VIA rings 78 and 80 to place antenna port castillation 60 inside dual VIA rings 78 and 80 and away from antenna probe center conductor 16. This allows for the insertion of a standard fifty (50) Ohm microstrip line 56. This feature physically separates diplexer antenna port 56 from center conductor 16 and allows this transition to be built in two phases, streamlining the board manufacturing process considerably. For one, ceramic diplexer 14 can be installed earlier during the pick and place process along with all the other electrical components and already establishes an electrical connection on one side of transition 56. PCB 10 can then proceed through all of the standard in-circuit tests and functional tests without any special fixturing for an antenna probe assembly. Once microwave functional tests are required, antenna probe assembly 24 can be installed with an independent solder operation which electrically connects center conductor 16 to its solder pad 18. This physical separation of the two transition end points also keeps ceramic diplexer 14 configuration simpler. An alternate transition configuration places the center conductor inside the ceramic substrate requiring the provision of an opening within the ceramic substrate (not shown). This would subsequently increase the cost of the diplexer due to the increased manufacturing process complexity of a large scale hole.

Figure 9:
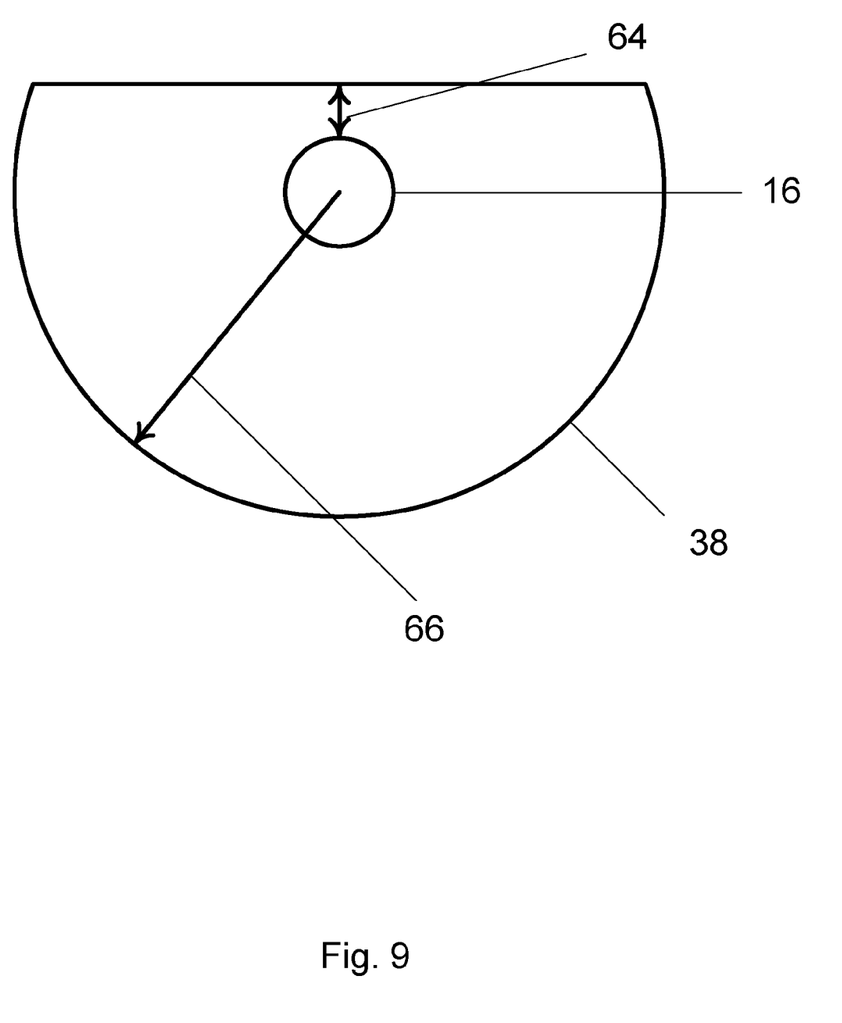
FIG. 9 shows a detailed depiction of the "D" style ground plane.

With the introduction of coaxial to microstrip transition 56, special features for the transition tuning had to be added. For one, a "D style" opening 38 in the ground plane below the microstrip line 56 was included, as shown in FIG. 8. The circular part of "D style" opening 38 is driven by the change in dielectric constant from the FR-4 style lower layers to the microwave substrate top layer. If the dielectric constant between these two sections of PCB 10 decreases and the diameter of center conductor 16 is unchanged, the diameter of the circular section of the ground plane opening 38 with respect to the dual VIA rings 78 and 80 has to decrease as well. The horizontal close-off section of opening 38, which gives it its characteristic "D-style" shape, was added to provide a reference to terminate the E-fields of the quasi-TEM waves propagating across microstrip line 56. Since a trade-off has to be achieved between providing an amount of ground plane underneath microstrip line 56 and the amount of circular aperture within "D-style" opening 38, distance 64 between the tangent point of the center conductor, as shown in FIG. 9, and the horizontal edge of "D style" opening 38 was optimized to provide good return loss into the transition. Part of tuning or optimizing this transition was also the position and number of tuning VIAs 36 placed on the inside of the dual plated through hole VIA rings 78 and 80. Vertically tuning VIAs 36 cover only the thickness of the microwave substrate on the top of PCB 10 (between layer 1 and layer 2). The position of VIAs 36, the radius of circular aperture 66, and distance 64 of the transition was optimized using CAD EM simulation tools such that the return loss into the whole interface was maximized and the insertion loss of the interface was minimized.

Another important feature added to the interface's construction to guaranty the interface performance at Ku-band frequencies is to keep the diameter of non-plated through hole 48 and the diameter of antenna probe center conductor 16 separated by a small gap in the order of a couple mils. During the installation of antenna probe assembly 24 to PCB 10, this tight opening will prevent solder, which originated from solder pad 18, from traveling down along antenna probe center conductor 16 into non plated drill hole 48. This scenario would alter antenna probe center conductor 16 diameter which in turn would change the impedance of the vertical coax going through PCB 10 and degrade the interface's performance manifesting itself in reduced return loss and increased insertion loss.

Another feature is the protrusion of antenna probe center conductor 16 above the top surface of PCB 10. Its height is dimensioned such that it provides enough vertical extension to form a strong solder joint to solder pad 18 to meet standard IPC specifications and to provide for a rugged mechanical connection. At the same time it is kept short enough to prevent electromagnetic radiation from the tip of the antenna probe center conductor 16 ending.

FIG. 10 shows a zoomed out top view of an exemplary embodiment of the new interface design. Shown are all the interface elements already described in detail in the previously described figures. Also shown are exposed copper land patterns 12 for placement of a microwave cast shield 72 which surrounds the area around the coaxial to microstrip transition. Land pattern 12 in combination with microwave cast shield 72 form a cavity which acts like a Faraday cage and contains the electromagnetic fields of the microwaves propagating across the microstrip transmission lines, ceramic diplexer 14, and the described coaxial to microstrip interface. In order to meet electromagnetic emissions (EMI) requirements of various regulatory groups a highly conductive gasket is placed between the microwave cast shield walls and the copper land pattern 12 (not shown). This will successfully seal any gaps between the two elements which are usually the source for EMI leakage. The shape of the copper land pattern 12 and the cavity formed as such depends upon the printed circuit board layout and other electrical components placed within this area. Openings 68 and 70 in the land pattern and cavity shield walls are provided to connect the ceramic diplexer's receive and transmit port castillations 60 through microstrip transmission lines 58 and 50 with the transceivers receive and transmit chains.

Figure 11:
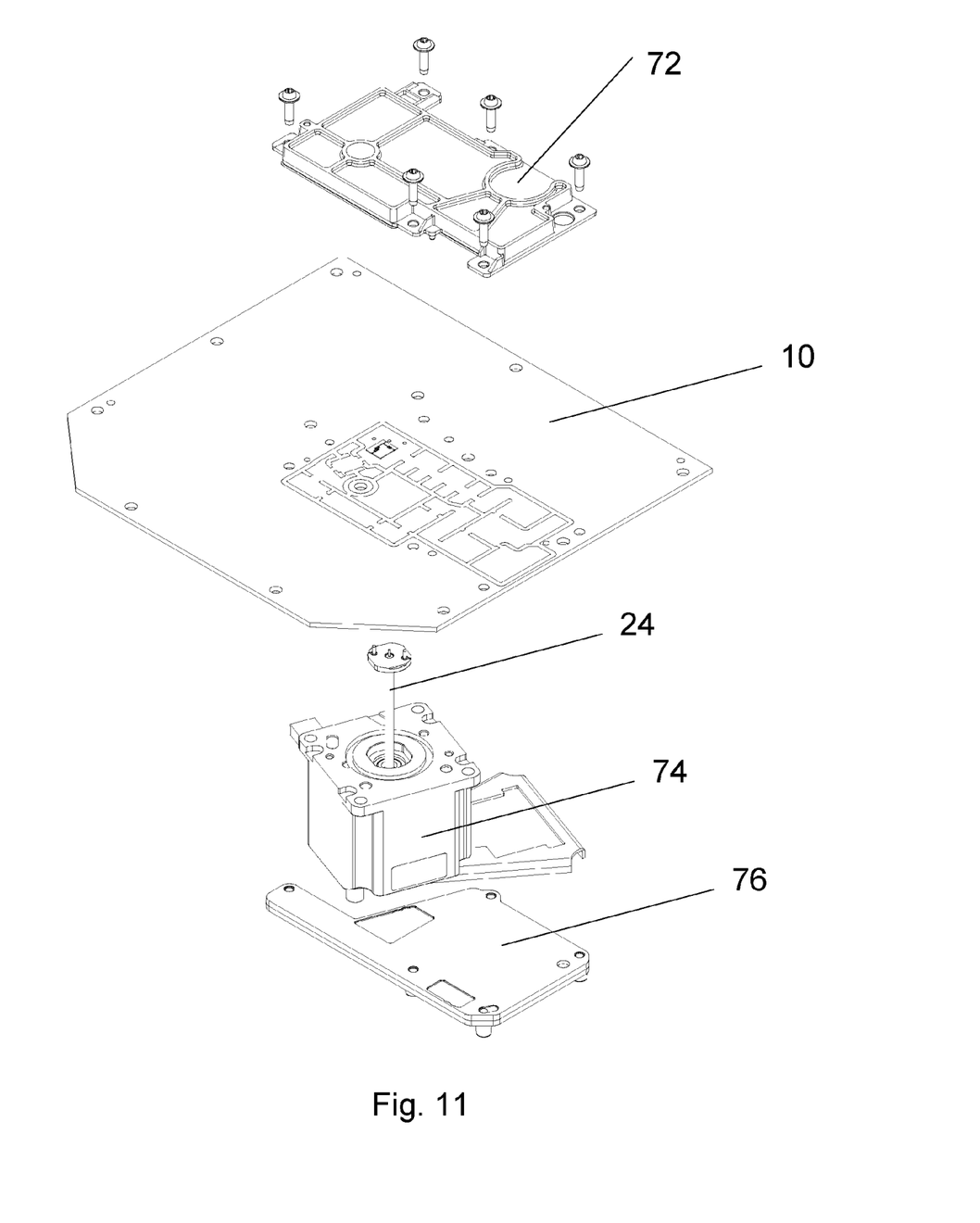
FIG. 11 is an exploded view of the coaxial to microstrip interface components.

FIG. 11 shows an exploded view of the interface components. Shown are mixed dielectric PCB 10 with antenna probe assembly 24 and microwave cast shield 72. Backing plate 76 provides a mechanical support platform for microwave cast shield 72 in which it supplies screw bosses to fasten the cast shield to the backing plate and sandwiching PCB 10 between the two elements forming a rigid assembly. Stepper motor assembly 74 is holding antenna probe assembly 24 fixed in its center. Stepper motor 74 acts as an additional structure for antenna probe assembly 24 and provides mechanical support over the two ends of the external semi rigid coaxial transmission line 26 making this assembly withstand extreme environments, such as vibration. At the same time stepper motor 74 also forces a tight connection of the antenna probe assembly 24 against the backside of PCB 10. This is achieved by fastening stepper motor 74 to the PCB's backside with screw connections from the PCB's top-side. As a whole, the described mechanical components and support features form a rigid structure which provide additional mechanical backing for the coaxial to microstrip interface components to assure proper performance under extreme environmental conditions such as a wide temperature range, thermal shock and vibration.

The performance of the depicted coaxial to microstrip transition can be described with standard S-parameters widely used in the industry—forward transmission coefficient S21 as a measure of gain or loss through the interface and return loss coefficient S11 as a measure of how well the transition's impedance is matched to a 50 Ohm system. The presented data in FIGS. 12 and 13 were taken using a 2-port network analyzer setup in conjunction with a high frequency probe station and the coaxial to microstrip interface as the unit under test.

Figure 12:
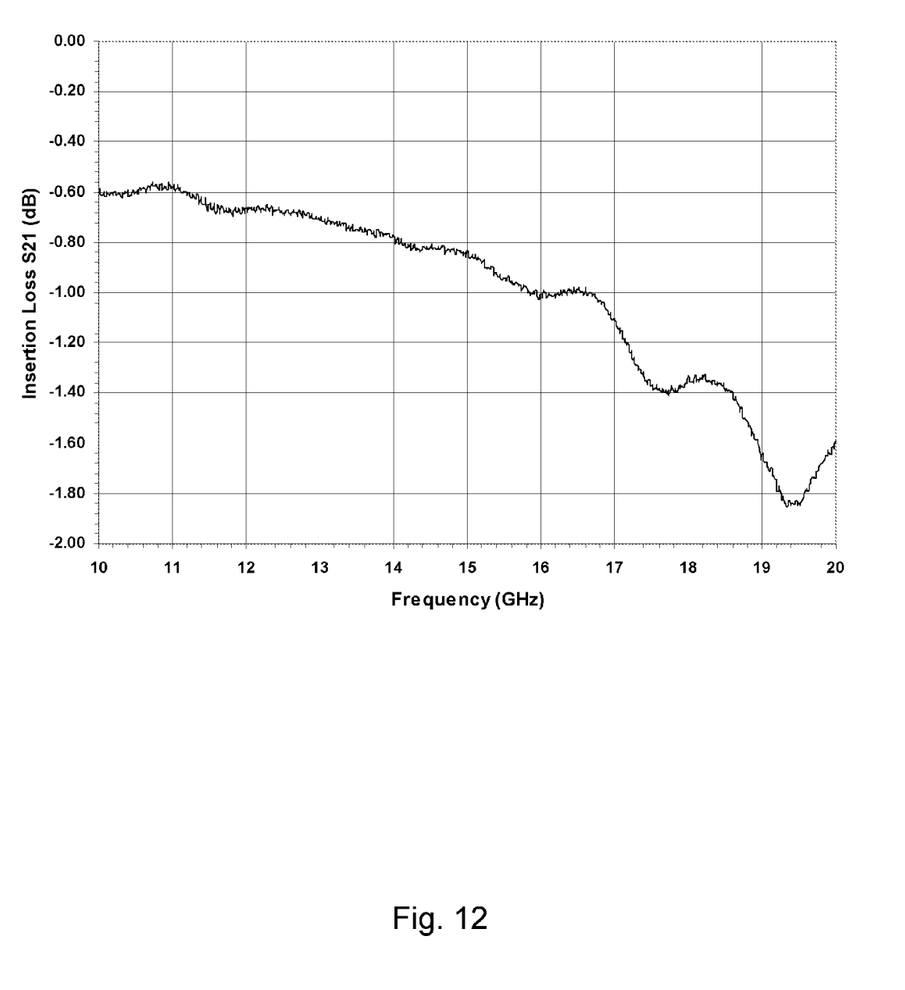
FIG. 12 is a graph of the wide band forward transmission response (S21) of the exemplary embodiment of the coaxial to microstrip interface.

FIG. 12 shows the wide band forward transmission response S21 of the present invention on the y-axis plotted versus frequency on the x-axis. The measurement is looking from the connectorized external semi-rigid coaxial transmission line into the antenna port of the ceramic diplexer castillation which was sampled with a high frequency probe station setup.

Figure 13:
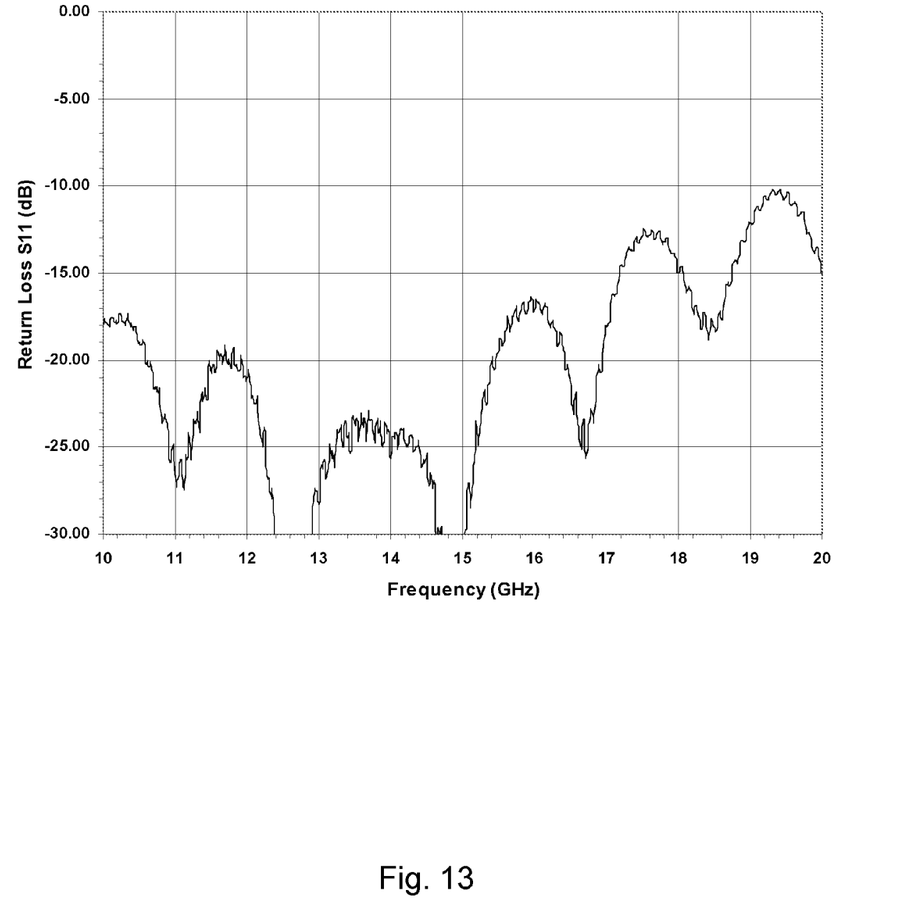
FIG. 13 is a graph of the wide band return loss (S11) of the exemplary embodiment of the coaxial to microstrip interface.

FIG. 13 shows the wide band return loss S11 of the present invention on the y-axis plotted versus frequency on the x-axis. The measurement is looking into the connectorized semi-rigid coaxial transmission line at the antenna feed point.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A coaxial to microstrip transition between a surface mounted diplexer and a mixed dielectric printed circuit board (PCB) for a wireless transceiver, the coaxial to microstrip transition comprising:
   a coaxial antenna probe electrically connected to an internal coaxial conductor disposed on the mixed dielectric PCB, wherein the internal coaxial conductor comprises two through VIA rings comprising a plurality of through VIAs;
   a microstrip transmission line disposed on the mixed dielectric PCB and electrically connected to the surface mounted diplexer; and
   a "D" style opening in a ground plane below the microstrip transmission line.

2. The coaxial to microstrip transition of claim 1 wherein the transition comprises the antenna probe mounted in a first direction and the surface mounted diplexer with transmit, receive, and antenna ports mounted in a second direction.

3. The coaxial to microstrip transition of claim 1 wherein the "D" style opening comprises a plurality of tuning VIAs between a first layer and a second layer of the mixed dielectric PCB.

4. The coaxial to microstrip transition of claim 3 wherein the plurality of tuning VIAs between the first layer and the second layer comprise the plurality of tuning VIAs disposed on a high frequency substrate.

5. The coaxial to microstrip transition of claim 3 wherein the tuning VIAs are disposed inside the two through VIA rings.

6. The coaxial to microstrip transition of claim 1 wherein the coaxial antenna probe comprises a semi rigid coaxial conductor comprising a low loss, low-density dielectric.

7. The coaxial to microstrip transition of claim 1 wherein an antenna probe base of the antenna probe and a backside of said PCB are configured to comprise a high frequency parallel plate capacitor.

8. The coaxial to microstrip transition of claim 1 wherein the two through VIA rings comprise an inner VIA ring wherein a distance between neighboring ones of said plurality of through VIAs in the inner VIA ring is substantially spaced one-twentieth of a wavelength of a frequency of the transceiver.

9. The coaxial to microstrip transition of claim 8 wherein the two through VIA rings comprise an outer VIA ring wherein each of the plurality of through VIAs in the outer VIA ring is disposed between gaps in the plurality of through VIAs in the inner VIA ring.

10. The coaxial to microstrip transition of claim 1 wherein the surface mounted diplexer is positioned on an edge of the two through VIA rings.

11. The coaxial to microstrip transition of claim 10 wherein an antenna port castellation of the surface mounted diplexer is located inside the two through VIA rings and away from a a center of said coaxial antenna probe.

12. The coaxial to microstrip transition of claim 1 further comprising a microwave cast shield surrounding the coaxial to microstrip transition.

13. The coaxial to microstrip transition of claim 1 further comprising a stepper motor to hold the coaxial antenna probe.

14. The coaxial to microstrip transition of claim 1 wherein the coaxial antenna probe is electrically connected to the surface mounted diplexer.

15. The coaxial to microstrip transition of claim 1 wherein the mixed dielectric PCB comprises a single layer, high-frequency substrate on multiple FR-4 layers.

16. A method of transitioning between a coaxial transmission line to a microstrip transmission line of a surface mounted diplexer and a mixed dielectric printed circuit board (PCB) for a wireless transceiver, the method comprising the steps of:
   connecting a coaxial antenna probe to an internal coaxial conductor disposed on the mixed dielectric PCB, wherein the internal coaxial conductor comprises two through VIA rings comprising a plurality of through VIAs;
   disposing a microstrip transmission line on the mixed dielectric PCB;
   electrically connecting the microstrip transmission line to the surface mounted diplexer; and
   providing a "D" style opening in a ground plane below the microstrip transmission line.

17. The method of claim 16 wherein the step of transitioning comprises the coaxial antenna probe being mounted in a first direction and the surface mounted diplexer with transmit and receive ports being mounted in a second direction.

18. The method of claim 16 wherein the step of providing said "D" style opening comprises disposing a plurality of tuning VIAs between a first layer and a second layer of the mixed dielectric PCB.

19. The method of claim 18 further comprising the step of disposing the tuning VIAs inside the two through VIA rings.

20. The method of claim 16 wherein the coaxial antenna probe comprises a semi rigid coaxial conductor comprising a low loss, low-density dielectric.

21. The method of claim 16 further comprising the step of forming a high frequency parallel plate capacitor by mounting an antenna probe base of the coaxial antenna probe and to a backside of said PCB.

22. The method of claim 16 wherein the two through VIA rings comprise an inner VIA ring and including the step of spacing neighboring ones of said plurality of through VIAs in the inner VIA ring at substantially one-twentieth of a wavelength of a frequency of the transceiver.

23. The method of claim 22 wherein the two through VIA rings comprise an outer VIA ring and including the step of disposing each of the plurality of through VIAs in the outer VIA ring between gaps in the plurality of through VIAs in the inner VIA ring.

24. The method of claim 16 further comprising the step of positioning the surface mounted diplexer on an edge of the two through VIA rings.

25. The method of claim 24 wherein the step of positioning comprises locating an antenna port castellation of the surface mounted diplexer inside the two through VIA rings and away from a a center of said coaxial antenna probe.

26. The method of claim 16 further comprising the step of surrounding the coaxial to microstrip transition with a microwave cast shield.

27. The method of claim 16 further comprising the step of holding the coaxial antenna probe with a stepper motor.

\* \* \* \* \*